United States Patent
Kyogoku

(10) Patent No.: US 8,525,864 B2
(45) Date of Patent: Sep. 3, 2013

(54) SEMICONDUCTOR LASER DRIVER AND IMAGE FORMING APPARATUS INCORPORATING SAME

(75) Inventor: Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 147 days.

(21) Appl. No.: 13/051,332

(22) Filed: Mar. 18, 2011

(65) Prior Publication Data

US 2011/0228034 A1    Sep. 22, 2011

(30) Foreign Application Priority Data

Mar. 18, 2010   (JP) .................................. 2010-062456

(51) Int. Cl.
*B41J 2/47*   (2006.01)
*B41J 2/435*  (2006.01)

(52) U.S. Cl.
USPC .......................................... 347/247; 347/237

(58) Field of Classification Search
None
See application file for complete search history.

(56) References Cited

U.S. PATENT DOCUMENTS

2007/0216756 A1 * 9/2007 Komiya et al. ............... 347/246
2010/0245527 A1 * 9/2010 Sakita et al. .................. 347/224

FOREIGN PATENT DOCUMENTS

| JP | 2000-71510 | 3/2000 |
|---|---|---|
| JP | 3466599 | 8/2003 |
| JP | 38809 14 | 11/2006 |
| JP | 2007-73543 | 3/2007 |
| JP | 4108321 | 4/2008 |
| JP | 2008-281864 | 11/2008 |
| JP | 2009-164191 | 7/2009 |
| JP | 4427277 | 12/2009 |
| JP | 4471597 | 3/2010 |
| JP | 4504710 | 4/2010 |

* cited by examiner

*Primary Examiner* — Matthew Luu
*Assistant Examiner* — Kendrick Liu
(74) *Attorney, Agent, or Firm* — Cooper & Dunham LLP

(57) ABSTRACT

A semiconductor laser driver to drive a semiconductor laser, the semiconductor laser includes a drive circuit to generate a drive current to cause the semiconductor laser to emit, and a current control circuit to cause the driving current to repeatedly increase and decrease in a predetermined cycle.

6 Claims, 13 Drawing Sheets

SEMICONDUCTOR LASER DRIVER AND IMAGE FORMING APPARATUS INCORPORATING SAME

TECHNICAL FIELD

The present disclosure relates to a semiconductor laser driver, and an image forming apparatus including the semiconductor laser driver.

BACKGROUND ART

Recently, semiconductor laser diodes have come to be widely used in a variety of types of electrical equipment, for example, laser printers, optical disk apparatuses, fiber-optic communication apparatuses, and mobile phones, because of their compact size, low cost, and ease of use.

However, the current/quantity of light characteristic of the semiconductor laser diode is dependent on temperature. Accordingly, it is necessary to control quantity of light to obtain a predetermined quantity of light reliably. This quantity of light control is called Automatic Power Control (APC). In the APC process, before the semiconductor laser diode is actually driven, the laser diode is driven in advance, the quantity of light from the laser diode is received by a photo diode (PD), and the detection current values of corresponding quantities of light are stored in a storage device. Then, the semiconductor laser diode is controlled using the current values saved in the storage device so as to obtain a desired quantity of light reliably.

FIG. 1 is a schematic diagram illustrating a related art image forming apparatus 200X. As illustrated in FIG. 1, the image forming apparatus 200X may be a copier, a facsimile machine, a printer, a multifunction printer using electrophotographic process used in a copier, a facsimile machine, a printer, a multifunction printer having at least one of copying, printing, scanning, plotter, and facsimile functions, or the like.

In FIG. 1, the image forming apparatus 200X includes a semiconductor laser unit (edge emitting laser unit) 1, a polygon mirror 2, a scanning lens 3, a photoreceptor 4, a beam sensor 5, an image control unit 6, and a laser driver 7.

In an image forming process, a semiconductor laser (laser diode) LD (edge-emitting laser unit) functioning as a lighting source in the semiconductor laser unit 1 emits a laser beam, and the laser beam is scanned (deflected) by the polygon mirror 2 that rotates at a predetermined velocity. Then, the lased beam forms a lighting spot on the photoreceptor 4 (scanned medium) via the scanning lens 3 (f θ lens).

The deflected laser beam scans and exposes in a main scanning direction orthogonal to a sub-scanning direction in which the photoreceptor 4 rotates, and records image signals with respect to each line thereof.

The beam sensor 5 is disposed at a position at which the laser beam is radiated, that is, a position close to the one end of the photoreceptor 4, to generate a main scanning synchronized signal. The image control unit 6 generates image data Di and automatic power control (APC) timing signal Sapcsh synchronized with the main scanning synchronized signal. The semiconductor laser driver 7 controls power of lighting of laser diode LD based on the APC timing signal Sapcsh, and emits the semiconductor laser LD, synchronized with the image data D.

While the semiconductor driver 7 controls the emission time of the semiconductor laser LD based on the APC timing signal Sapcsh generated in the image control unit 6, the laser LD repeatedly scans on the photoreceptor 4 in the main scanning direction at a predetermined cycle in accordance with the rotation velocity and the recording density, thus forming a latent image on a surface of the photoreceptor 4.

In the above-described beam scanning-type image forming apparatus, the laser beam is deflected by the polygon mirror 2 at equal angular velocities, and in order to keep the scanning speed on the scanned medium (photoreceptor) constant, fθ lenses and fθ mirrors are used.

Although the scanning speed of the laser beam deflected by the fθ lens or the fθ mirror on the scanned medium is substantially constant, light-emission intensity of the laser beam on the scanned medium may change based on image height of fθ lens. "Image height" is a distance from the center of the photoreceptor in a main scanning direction of the photoreceptor. Light-use efficiency, for example, transmissivity and reflectance of optical elements (glass, lens, and mirror) through which the laser beam emitted from the semiconductor laser LD onto the scanning medium (photoconductor), differs depending on an incident angle of the laser beam, and the thickness of the fθ lenses are different, thus resulting in the fluctuation of beam intensity (light emission amounts) based on the image height. The fluctuation of the beam intensity based on the image height is called "shading characteristic".

Fluctuation in the beam intensity due to the shading characteristic is typically between 10 and 20%, and affects the density of the image to be formed. Since the transmittance of the optical lens decreases as the image height increases, it is necessary to increase the light-emission intensity of the semiconductor laser LD in accordance with the image height, so as to supply the light-emission intensity from semiconductor laser LD where the image height is ±0 to the photoreceptor 4. Controlling the light-emission intensity such that the error generated by the shading characteristics are absorbed is called "Shading correction".

The shading characteristics are determined by characteristics and arrangement of optical elements. At the same time, fluctuation caused in the image forming apparatus and the fluctuation caused by temperature, humidity, and ambient temperature are slight. That is, when the characteristics and the arrangement in the device are decided, a correction condition for the shading correction can be set in common in the device for all image forming apparatuses because each image forming apparatus is not required to be set separately.

The light level of the light beam to be emitted by the light source is controlled based on the level of the light beam (exposure amount) that reaches the surface of the photoconductor, for example, as described in JP-H06-255172-A. This approach, however, requires a light level detection sensor capable of detecting the light level of the light beam at the surface of the photoconductor, and an additional control circuit controls the light level of the light beam based on the detection result of the light level detection sensor. As a result, the control mechanism becomes complicated, and manufacturing cost increases.

JP-2005-11943-A proposes a semiconductor laser driver that can perform shading correction by changing a reference voltage Vref without executing APC. More specifically, an emission current In is generated by the output current of a digital analog converter (DAC). The output current of the DAC is proportional to the reference voltage Vref, and the emission current In is proportional to the reference voltage Vref. That is, the emission amount (Po) of the semiconductor laser LD is proportional to the reference voltage Vref in this example semiconductor laser driver. Without performing PAC, by adjusting the reference voltage Vref, the shading correction can be performed.

JP-2003-71510-A proposes a control method to control the quantity of the light of the light source based on correction data of the light quantity that is given in advance, corresponding to scanning position of the light spot. In this example, as a transmitting method to transmit the correction data of the light quantity to a LD modulation circuit, an output signal of the DAC is smoothed and the smoothed signal is input to the LD modulator as a light-quantity correction signal LDLVL.

Similarly, as described in the JP-2005-262509-A, a pulse width modulation (PWM) signal is smoothed by LPF, and is output to the LD controller as a light-quantity control signal.

In these examples, by inputting the light-quantity correction data and the light-quantity adjustment signal to the above-described semiconductor laser driver, the quantity of the light of the laser diode LD is determined by an analog light intensity signal that is supplied to the LD controller, and the operation of the shading correction is executed by adjusting the level of this analog signal in accordance with the position in the main scanning direction.

The position in the main-scanning direction and the quantity of the light of the laser diode LD is determined by setting a position standard in the main scanning direction based on a synchronized signal and dividing the line cycle from this position into respective areas. The analog signal is then controlled for each of the respective areas.

In the image forming apparatus 200X shown in FIG. 1, the optical unit, such as, the semiconductor laser driver 7, the laser unit 1, the polygon mirror 2, and the scanning lenses 3 are configured as a laser scan unit (hereinafter "LSU"). In order to activate the semiconductor laser LD rapidly, the semiconductor laser driver 7 and the laser unit 1 are provided in a same LD board, and disposed close to each other. It is preferable that the LD board is small so that the LD board is fit into the gaps among the LSU. By contrast, the image control unit 6 is mounted in a main board including a central processing unit (CPU), random access memory (RAM), read only memory (ROM), and an image memory.

FIG. 2 is a conceptual diagram of a related art laser diode (LD) board 7000 mounting a related art laser driver 7 and a main board 60X mounting the image control unit 6, provided in an image forming apparatus 200X. Herein, the semiconductor laser driver 7 mounted in the LD board 7000 and the image control unit 6 mounted in main board 60X are connected via a cable that is usually longer than 1 m. A supply voltage from a power supply and a ground voltage (GND) are supplied from the main board 60X to the LD board 7000 via the cable. Because a consumption current of the semiconductor laser driver 7 and a driving current for emitting the semiconductor laser LD are transmitted through voltage-transmission lines connecting to the power supply or the ground voltage, voltage down (drops) and voltage up (boosts) are generated in the voltage transmission lines by resistance of the cable.

Thus, voltage generated in the image control unit 6 differs from the voltage received in the semiconductor laser driver 7 in direct current (DC). In addition, the current fluctuates due to switching the semiconductor laser LD on and off during image formation, and accordingly the supply voltage and the ground voltage in the LD board 7000 fluctuate from point of an alternative current (AC). Thus, since the voltage fluctuates in the cable therebetween from the point of DC and AC, error may be generated in the emission amount with respect to a setting value of the quantity of the light.

In addition, recently, semiconductor lasers LD have come to be required to control the emission amount of the semiconductor laser LD with a high degree of accuracy while executing shading correction, so as to reduce the cost and increase image quality.

SUMMARY

This patent specification describes a novel semiconductor driver. In as aspect of this disclosure, there is provided a semiconductor laser driver to drive at least one semiconductor laser, including a drive circuit and a current control circuit. The drive circuit generates a driving current to cause the semiconductor laser to emit. The current control circuit causes the driving current to repeatedly increase and decrease in a predetermined cycle.

Additional aspects, there is provided an image forming apparatus including at least one semiconductor laser to emit light, an image control unit to generate image data and an automatic power control signal to obtain a predetermined light-emission intensity of light for the semiconductor laser, and the above-described semiconductor laser driver to receive the image data and the automatic power control signal output from the image control unit.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
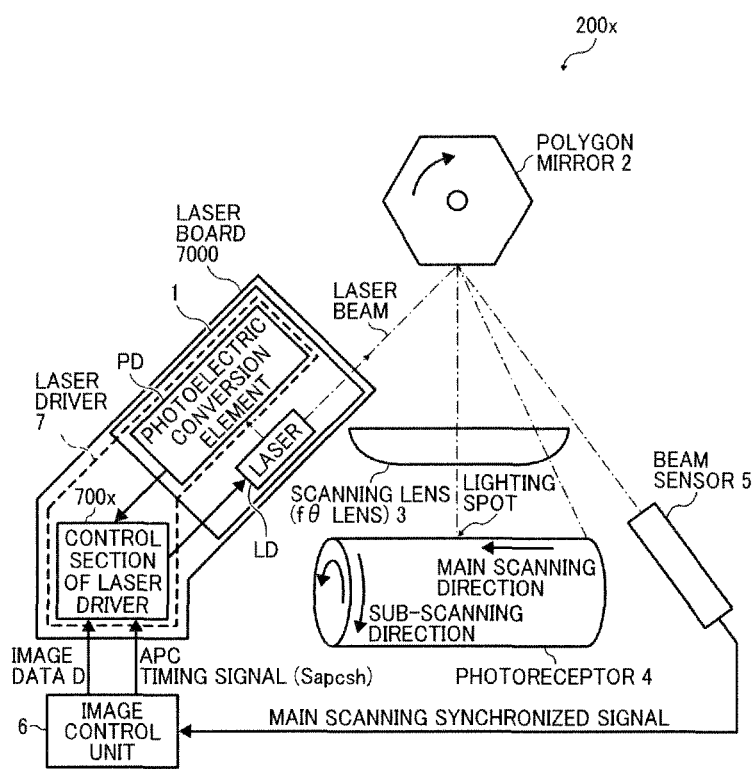
FIG. 1 illustrates a schematic diagram of a related art image forming apparatus including a semiconductor laser driver and an image control unit.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 4:
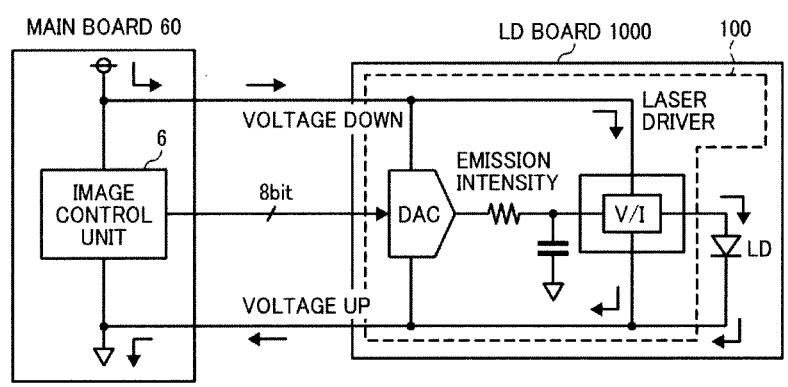
FIG. 4 is a schematic diagram of a laser board mounting the semiconductor laser driver shown in FIG. 3 and a main board mounting the image control unit.
Figure 5:
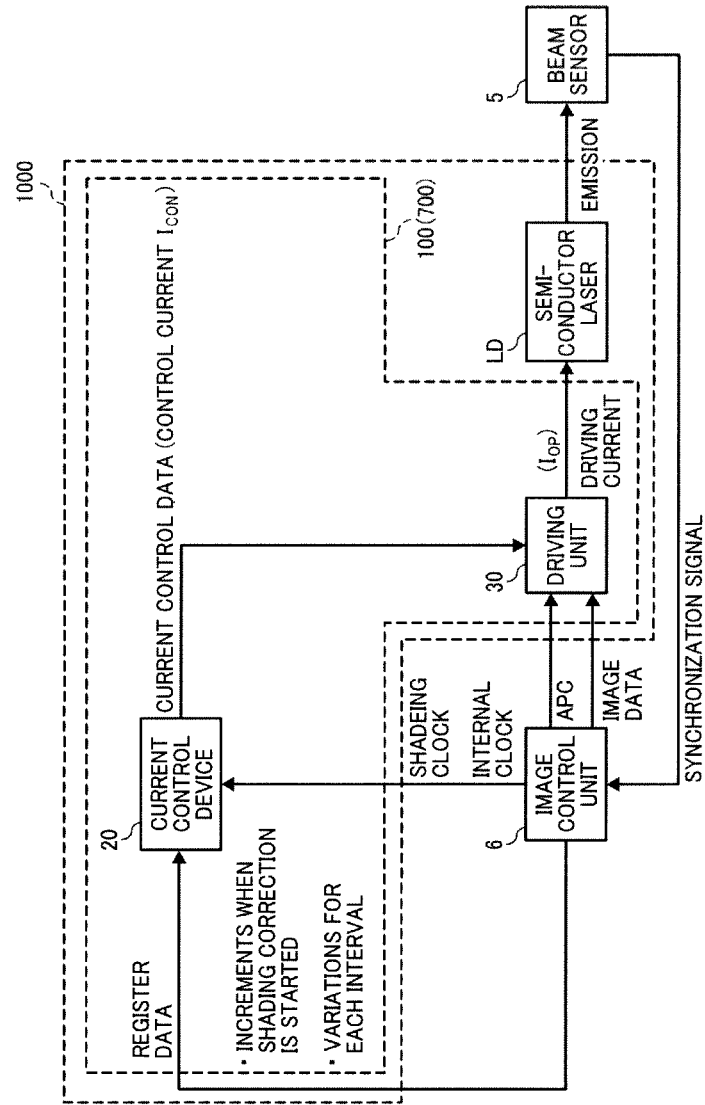
FIG. 5 is a block diagram illustrating vicinity of the semiconductor laser driver shown in FIG. 4.

Referring now to the drawings, wherein like reference numerals designate identical or corresponding parts throughout the several views, particularly to FIGS. 4 and 5, a semiconductor laser driver 100 according to an illustrative embodiment is described.

Figure 3:
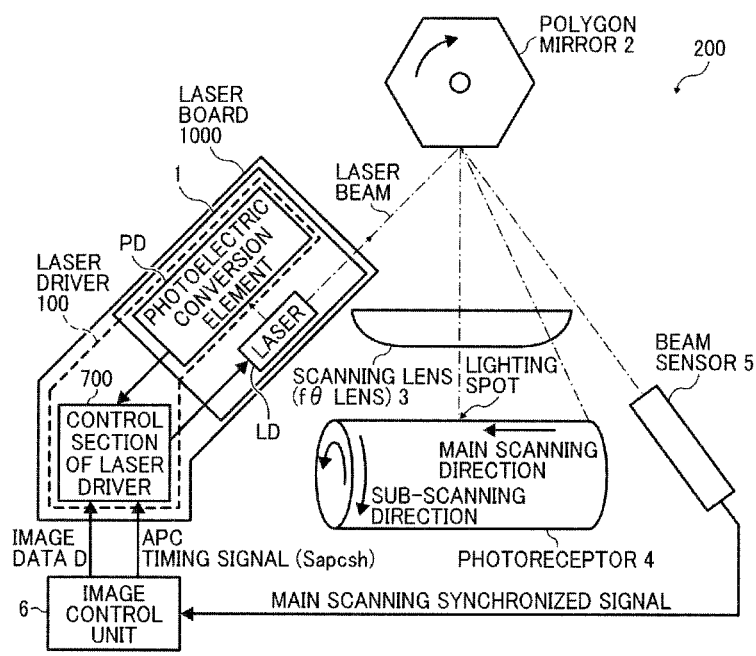
FIG. 3 illustrates a schematic diagram of an image forming apparatus including a semiconductor laser driver according to a first illustrative embodiment.

FIG. 3 illustrates a schematic diagram of an image forming apparatus 200 according to a first illustrative embodiment. In FIG. 3, the image forming apparatus 200 includes a semiconductor laser unit 1 (edge-emitting laser) 1, a polygon mirror 2, a scanning lens 3, a photoreceptor 4, a beam sensor 5, an image control unit 6, and a semiconductor laser drier 100. The semiconductor laser unit 1, including a semiconductor laser (laser diode) LD and a photoelectric conversion element PD, and the semiconductor laser driver 100 are integrated onto a same laser board 7000.

Figure 2:
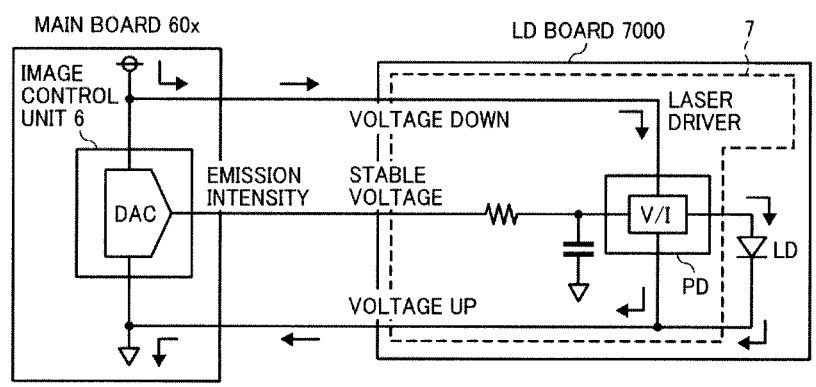
FIG. 2 is a schematic diagram of a related art laser board mounting the semiconductor laser driver shown in FIG. 1 and a main board mounting the image control unit.

FIG. 4 is a schematic diagram of a laser board 1000 mounting the semiconductor laser driver shown in FIG. 3 and a main board 60 mounting the image control unit 6. In a comparative example, the data to set the light-emission intensities of the semiconductor laser LD is sent from the image control unit 6 mounted in a main board 60x (see FIG. 2) to the semiconductor laser driver 7 mounted in a laser board 7000 by an analog voltage.

By contrast, in the present embodiment, the semiconductor laser driver 100 includes an analog voltage generation circuit constructed of a digital-analog converter (DAC), to determine the light-emission intensity. Thus, the effects of the voltage down (drops) and the voltage up (boosts) due to the resistance of the cable connected between the image control unit 6 mounted in a main board 60 and the semiconductor laser driver 100 mounted in a laser board 1000 can be eliminated, enabling stable light-emission intensity.

First Embodiment

Configuration of the Semiconductor Laser Driver

FIG. 5 is a block diagram illustrating vicinity of the semiconductor laser driver 100 according to the present embodiment. The configuration of the semiconductor laser driver 100 is described below, with reference to FIG. 5. The semiconductor laser driver 100 includes a current control circuit 20 and a drive circuit 30. The drive circuit 30 generates a driving current Iop to drive the semiconductor laser LD. The current control circuit 20 generates a control current Icon (image control data) that causes the semiconductor laser LD to emit so that the driving current Iop is increased and decreased repeatedly at a predetermined cycle. The current control circuit 20 is provided in a preceding step from the drive circuit 30. The control circuit 20 divides a period during which the control current Icon is increased and decreased into multiple equal intervals, and registers 22 and 25 (see FIG. 5) set increments for the control current Icon (driving current Iop) when the shading correction is started and variations for the control current Icon (driving current) for each interval. The current control circuit 30 causes the driving current Iop to increase and decrease in a period in which the shading correction is performed in accordance with the above-described setting values (the increments at time of starting shading correction and the variations for each interval) in the registers 22 and 25. In FIG. 5, the increase and decrease of the control current Icon in the current control circuit 20 is controlled by a shading clock signal and an internal clock signal.

Next, a configuration of the current control circuit 20 is described below with reference to FIG. 6.

Figure 6:
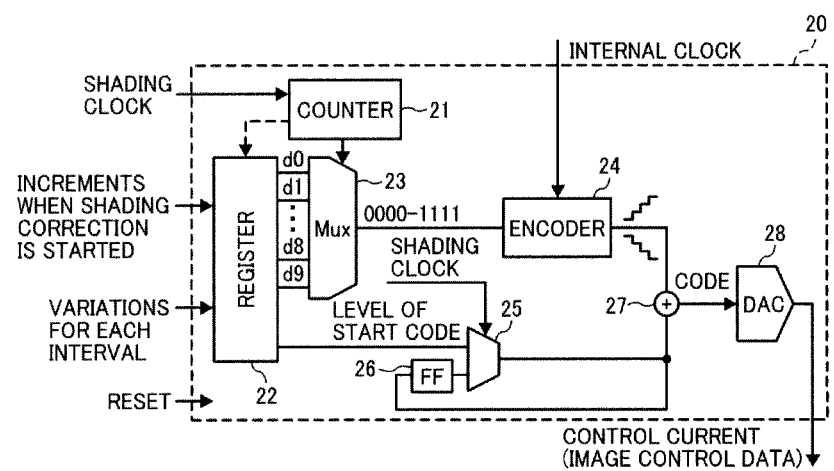
FIG. 6 is a block diagram illustrating a current control circuit included in the semiconductor laser driver shown in FIG. 5.

FIG. 6 is a block diagram illustrating the current control circuit 20 included in the semiconductor laser driver 100. In FIG. 6, the current control circuit 20 includes a counter 21, a register 22, a multiplexer (Mux) 23, an encoder 24, a register 25, a flip-flop circuit 26, an adder (+) 27, and a digital-analog converter (DAC) 28.

The shading clock signal is input to the counter 21, and the counter 21 counts the number of shading clock signals and outputs a counting result.

The increments for shading code (control current Icon) when the shading correction is started, the variations for each interval, and the number of the shading clock signals counted in the counter 21 are input to the register 22. Then, the register 22 sets a level of start code that is an initial code of the shading code while the shading correction is performed, variation data stored in setting registers d0 through d9 for each interval based on the increments for the shading code when shading correction is started and the variations for each interval. The level of start code and variation data stored in setting registers d0 through d9 for each interval are for controlling the shading code for each interval in a period during which the shading correction is performed. Then, the register 22 outputs the level of start code to the register 25 and outputs variation data stored in the setting registers d0 through d9 for each interval to the multiplexer (Mux) 23.

The variation data stored in the setting registers d0 through d9 for each interval output from the register 22 is input to the multiplexer 23, and the multiplexer 23 outputs one of data code from 0000 to 1111 corresponding to the variation data stored in the setting registers d0 through d9 for each interval.

The data code 0000 through 1111 output from the multiplexer 23 and the internal clock signal are input to the encoder 24, and the encoder 24 converts the data code 0000 through 1111 into variation patterns in which the one interval divided in quarters, synchronized with the internal clock signal.

The flip-flop circuit (FF) 26 is connected to the adder 27 and outputs a preceding code that is one preceding interval of the variation patterns. The preceding code that is one preceding interval of the variation patterns, the shading clock signal, and the level of start code output from the register 22 are input to the register 25. The register 25 stores the level of the start code and the preceding code that is one preceding interval of the variation patterns and outputs a level of present shading code when the preceding intervals of the variation pattern (shading clock signal cycle) is finished to the adder 27 when the shading clock signal is input.

The first shading code output from the encoder 27 and the level of the present shading code that is one preceding shading clock cycle is finished output from the register 25 are input to the adder 27, and the adder 27 adds the two shading codes, and outputs an added code signal as a third shading code to the DAC 28. The DAC 28 converts the signal of the third shading code from the adder 27 to an analog signal and outputs the analog signal.

More specifically, in the above-configured current control circuit 20, during resetting, a center code, that is, 80h code is input to the digital-analog converter 28 whose bit number is 8 bit. After resetting, the level of start code is input to the register 25 by inputting an initial shading clock signal to the counter 21. Then, after a secondary shading clock signal, one of the data codes 0000 through 1111 corresponding to the order from the setting registers d0 through d9 in series are subsequently output from the multiplexer 23 in accordance with the counting number of the counter 21. The encoder 24 converts the data code output from the multiplexer 23 into the variation patterns that divining the actual variation. Then, the adder 27 adds variation pattern (first shading code) to a present code (second shading code) and outputs the added code to the digital analog converter 28 as a following code (third shading code). The digital-analog converter 28 changes an output signal within a range from 00h to FFh at ±25% with a center around 80h at 0.2% intervals.

Next, the configuration of the drive circuit 30 is described below with reference to FIG. 7.

Figure 7:
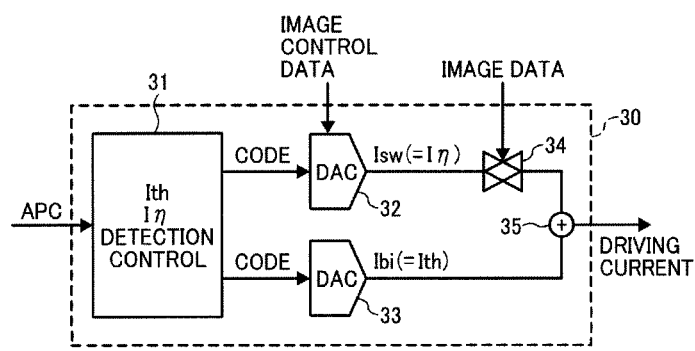
FIG. 7 is a block diagram illustrating a drive circuit included in the semiconductor laser driver shown in FIG. 5.

FIG. 7 is a block diagram illustrating the drive circuit 30 included in the semiconductor laser driver 100. In FIG. 7, the drive circuit 30 includes an IthIη detection controller 31, digital analog converters (DAC) 32 and 33, a switch 34, and adder 35. The APC signal generated in the image control unit 6 is input to the IthIη detection controller 31, and the IthIη detection controller 31 outputs a code corresponding to the threshold current Ith and a code corresponding to the emission current Iη.

The threshold current Ith and the emission current Iη are described blow.

Figure 8:
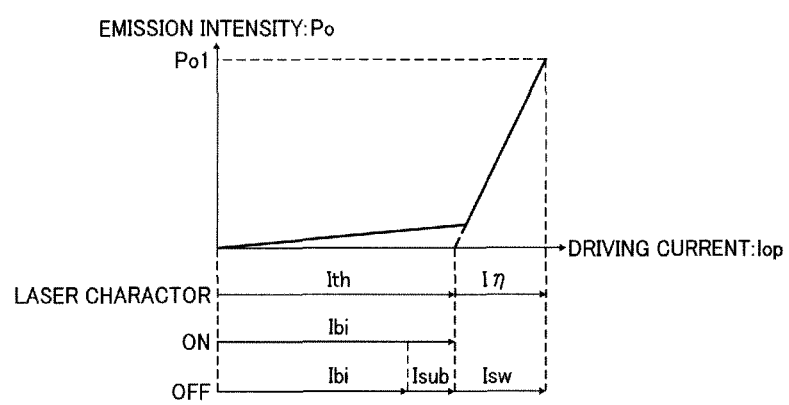
FIG. 8 is a diagram illustrating a light-current feature curve between a current-light feature of light-emission intensities of a laser and a light-current feature of a driving current of the semiconductor laser.

FIG. 8 is a diagram illustrating a feature of emission amount (light-emission intensity) with respect to the driving current Iop of the semiconductor laser LD. As illustrated in FIG. 8, the semiconductor laser LD starts rapidly emitting a predetermined current value as a border current. The border current that the semiconductor laser LD starts rapidly emitting is a threshold current Ith. An emission current Iη is a current equal to or larger than the threshold current Ith. The emission current Iη of the semiconductor laser LD is proportional to the emission amount of the semiconductor laser LD. In the normal process, a general semiconductor laser driver 100 constantly supplies a bias current Ibi in spite of a period during which there is no image formation. The bias current Ibi is set a value slightly smaller than the threshold current Ith.

Referring back to FIG. 7, the digital analog converter 32 converts the code corresponding to the emission current Iη into an electric current as the emission current Iη.

The digital analog converter 32 receives the variation patterns of the control current Icon for each interval from the current control circuit 20 and converts it into an analog value in accordance with the light-emission intensity Po.

The switch 34 switches the emission current Iη on and off based on the image data signal (control current Icon) from the image control unit 6.

On the other hand, the digital analog converter 33 converts the code corresponding to the threshold current Ith into an electric current as the threshold current Ith.

The drive circuit 30 detects the respective the threshold current Ith and the emission current Iη separately and constantly supplies the current Ibi (=Ith) to the semiconductor laser LD with or without emission of the semiconductor laser LD, and adds a current Isw (=Iη) to the current Ibi during the semiconductor laser LD emits (ON). Namely, the emission amount (light-emission intensity) Po of the semiconductor laser LD is proportional to the control current Icon from the current control circuit 20. For example, when the control current Icon from the current control circuit 20 is increased 10%, the light-emission intensity Po of the semiconductor laser LD is increased 10%.

The detection method of the threshold current Ith and the emission current Iη is described in JP-2005-11943-A, and such description is incorporated herein.

(Operation of the Semiconductor Laser Driver)

Figure 9:
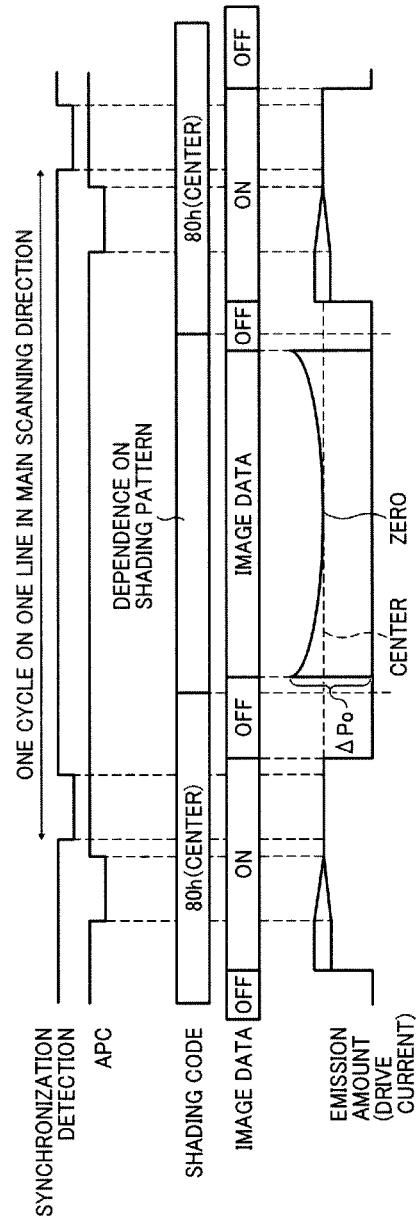
FIG. 9 is a timing chart illustrating a timing chart of shading correction in the semiconductor laser driver shown in FIG. 5.

Next, the operation of the semiconductor laser driver 100 is described with reference to FIG. 9. FIG. 9 is a timing chart illustrating a timing chart of shading correction in the semiconductor laser driver 100. In a normal process of the semiconductor laser driver 100, APC is executed before the synchronized detection signal is generated (switched on), and before APC is executed, the semiconductor laser LD is switched on. More specifically, the emission amount is exactly adjusted to a desired emission amount, after which, the synchronized detection signal is generated.

The emission amount of the semiconductor laser LD is adjusted under APC immediately before the synchronized detection, because the error occurs in the timing of the synchronism (synchronized detection) due to the blunting of the synchronized detection signal when the power of the synchronized detection signal fluctuates. The shading code is set to 80h (center range) other than during image formation, and the shading code is increased and decreased during image formation. Normally, the emission amount after APC, the emission amount when the synchronized detection signal is operated (signal=Low), and the emission amount in a portion in which the image height is set to zero are identical. In addition, the emission amount of the semiconductor laser LD is at maximum when the amount of the shading correction becomes maximum in the plus (+) side at points at which the image heights are maximum in both ends of the image range. The operation range of the shading correction is set wider than the image range in which the image data is input. Setting shading code to 80h (center) other than the image formation is not in the register but in the circuit. Herein, by setting an increment code Δcode of the shading code for the control current (driving current Iop) when the shading correction is started in the register 22, the level of the start code of the shading code for the emission amount (Po) when the shading correction is started can be set. At this time, the emission amount of the semiconductor laser LD is set maximum while the shading correction is performed.

It is to be noted that the code except during image formation may be set in the register 22. In addition, when the shading correction is started, the register 22 may also set not the increment code Δcode of the shading code but an increment of the driving current Iop directly.

Figure 10:
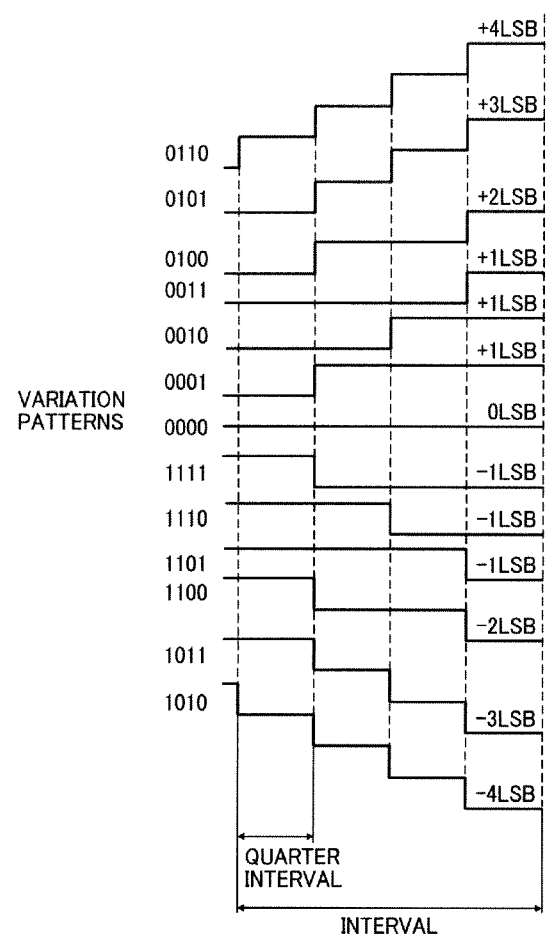
FIG. 10 illustrates variation patterns of a drive current for each interval controlled by the current control circuit.

FIG. 10 is a diagram illustrating variation patterns of the control current (image control data) for each interval in the shading operation. In FIG. 10, the current control circuit 30 divides the interval in which the control current is repeatedly increased and decreased into four equal quarter intervals. The variation patterns, for example, total 13 way patterns from −4 LSB to +4 LSB at 4 bit are set in the register 22. Then, the patterns set in the register 22 are subsequently readout, and the readout code is added to the increment code Δcode of the shading code when the shading correction is started, the 8 bit data can be generated as data that is divided quarter.

In the variation patterns shown in FIG. 10, when the start code is set to "100000000" and the variation pattern is set to "0110" of 4 bit data, 1000001→1000010→10000011→10000100 of the DAC code is generated. If the 8 bit data is set directly, 8 bit×4=32 bit (8 bit×4=32 bit) is required. By contrast when the 4 bit data is set, 4 bit data is required, that is, 28 bit (32−4=28 bit data) can be reduced.

Next, the shading operation of the semiconductor laser driver 100 is described below with reference to FIG. 11.

Figure 11:
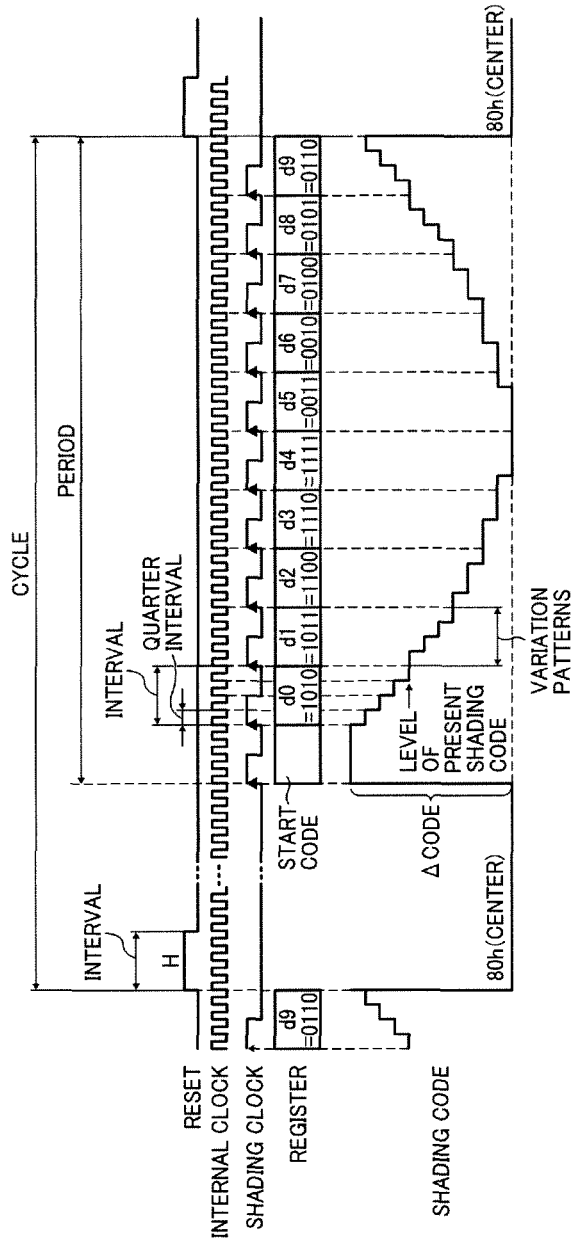
FIG. 11 illustrates detail timing chart of the shading correction in the semiconductor laser driver shown in FIG. 5.

FIG. 11 is a timing chart illustrating the shading operation of the semiconductor laser driver 100. More specifically, FIG. 11 shows processes of the shading code in a configuration in which the current variation patterns 0000 through 1111 are set in the setting registers d0 through d9.

In FIG. 11, when a reset signal goes high (=H), the shading code is set to the center value. After the reset signal is released, the current control circuit 20 reads in the start code, variation setting registers d0, d1,d2, d3, d4, d5, d6, d7, d8, and d9 in series, timed to coincidence with respective rising edges (↑) of the shading clock signals.

The DAC code is produced by adding the current variation patterns for each interval via the encoder 24 from the variation set in the register 22 to the level of start code. When the reset signal is high, the shading code is set to the center value. In this configuration, after the variation patterns in register d9 is set, the reset signal is generated, that is, the predetermined cycle of the control current for the driving current Iop is reset. In the present embodiment, only three signals, that is, the reset signal, the internal signal, and the shading clock signals are used for operating the shading correction during image formation. Thus, the configuration in the semiconductor laser driver 100 can be performed by a relatively simple mechanism.

As described above, the semiconductor laser driver 100 includes the current control circuit 20 to control the current that causes the semiconductor laser LD to emit so that the electrical current repeatedly increases and decreases at a predetermined cycle and the drive circuit 30 to generate and output the driving current Iop of the semiconductor laser LD in accordance with the variation patterns of the control current Icon from the current control circuit 20. In this embodiment, the current control circuit 20 and the drive circuit 30 are installed onto a single LD board. Therefore, a problem (e.g., voltage drops and voltage boosts) occurring in a configuration in which the current control circuit 20 and the drive circuit 30 are provided in separate boards can be solved. Accordingly, the emission amount of the semiconductor laser LD can be controlled with a high degree of accuracy when the shading correction is performed.

The cycle during which the current varies is divided into equal intervals, and starting increase and the change per cycle are set in register, and the driving current Iop is increased and decreased in accordance with setting value in the register.

That is, since the register stores the variation patterns of the control current in advance before the image formation, it does not need to constantly operate the digital data, for example, 8 bit, that is required for the shading, in the image forming.

Second Embodiment

Figure 12:
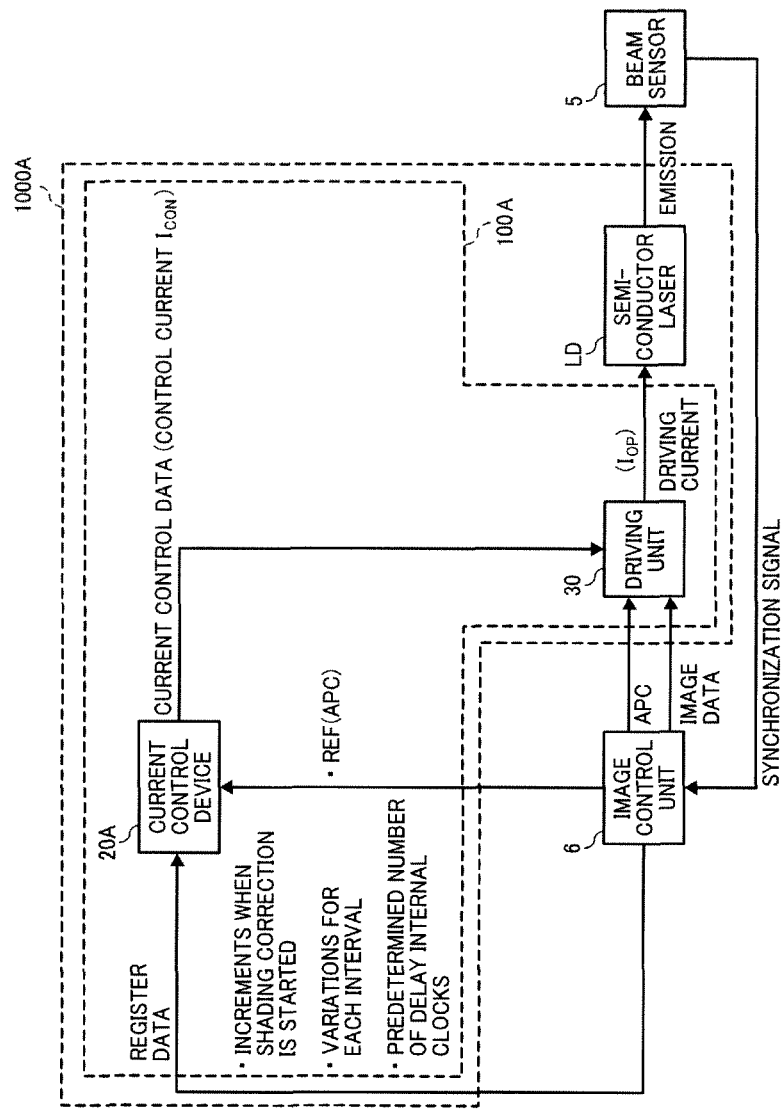
FIG. 12 is a block diagram illustrating vicinity of a semiconductor laser driver according to a second illustrative embodiment.

Next, a semiconductor laser driver 100A according to a second embodiment is described below with reference to FIG. 12.

In the semiconductor laser driver 100A, a current control circuit 20A controls the control current Icon (driving current Iop) based on a reference signal REF whose cycle is equal to the cycle in which the driving current Iop is increased and decreased repeatedly and a predetermined number of delay internal clock signals counted from the time at which the reference signal is input to the time at which the driving current Iop starts increasing and decreasing (the time at which shading correction is performed).

The current control circuit 20A according to the present embodiment is described below, with reference to FIG. 13.

Figure 13:
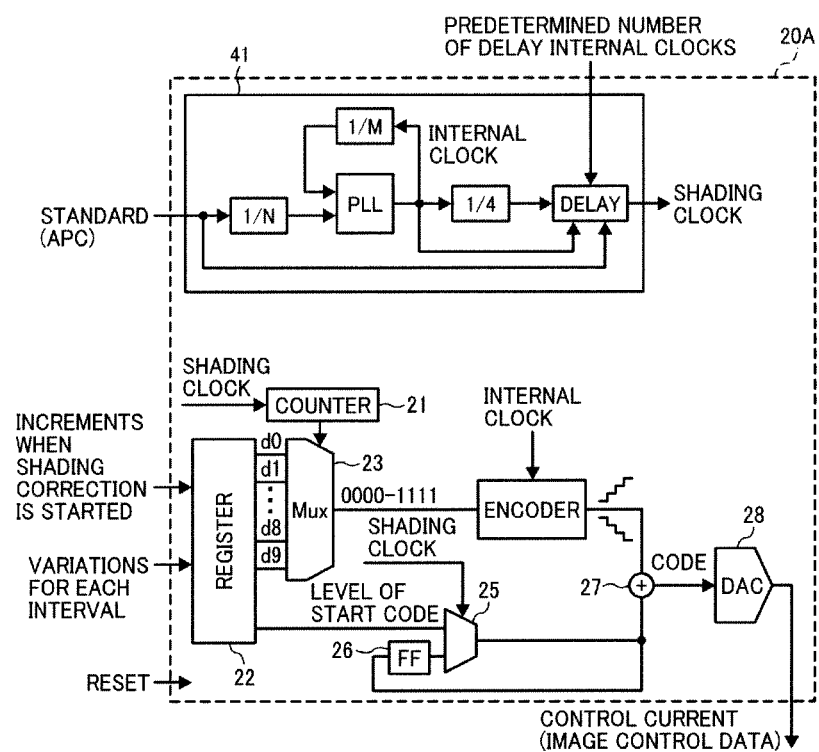
FIG. 13 is a block diagram illustrating a current control circuit included in the semiconductor laser driver shown in FIG. 12.

FIG. 13 is a block diagram illustrating of the current control circuit 20A. The current control circuit 20A further includes a shading clock generator 41 that generates the shading clock based on a reference signal and a delay clock, in addition to the component included in the current control circuit 20 shown in FIG. 6. The shading clock signal generator 41 includes three multiple-programmable dividers including a 1/N frequency divisor 42, a 1/M frequency divisor 43, a ¼ frequency divisor 44, a phase-locked loop circuit (PPL) 45, and a delay circuit 46. Thus, the reference signal is divided by the 1/N divisor 41, and the divided signal is pulse-cocked loop in the PPL 45, the shading clock signal generator 41 generates the internal clocks.

Figure 14:
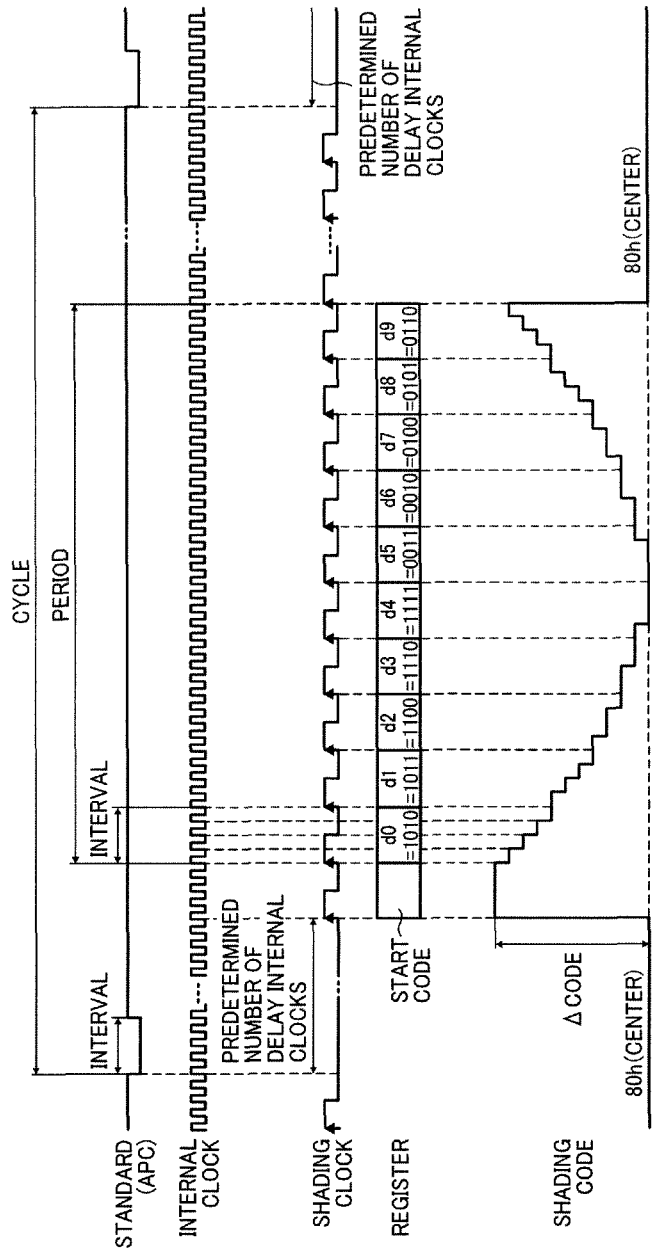
FIG. 14 is a detail timing chart illustrating shading correction in the semiconductor laser driver shown in FIG. 12.

Next, with reference to FIG. 14, the operation of the shading in the semiconductor laser driver 100A is described below. FIG. 14 is a timing chart illustrating the shading operation in the semiconductor laser driver 100A.

In this embodiment, the number of delay internal clock that is generated from the reference signal REF (APC) is stored in the register 22. The internal clock operates constantly. The current control circuit 20A causes the shading clock signal to start operating after the passage of a period during which a predetermined number of delay internal clock signals counted from the time at which the reference signal is input to the time at which the driving current Iop starts increasing and decreasing (the time at which shading correction is performed).

Other operation expect this operation is similar to the first embodiment

After the number of the registers is finished, that is, after the variations stored in the setting register d9 is set (used) for the shading code, the shading code is returned to the center code 80h. Although 10 patterns of the variation data stored in the setting registers d0 through d9 is set in the register 22 in the present embodiment, in order to set more precise pattern, greater number of the inputting signal of the setting registers and the multiplexer may be prepared in the current control circuit 20A (20).

The image data and the reference signal REF (APC) are generated in the image forming unit 6 based on the synchronized detection signal, and the time difference (delay time) between the image data and the reference signal REF (APC) is controlled by the image control unit 6. That is, the image control unit 6 controls the predetermined number of delay internal clock signals counted from the time at which the reference signal is input to the time the control current starts increasing and decreasing based on difference of the reference signal and the image data.

In order to set the shading range wider than the image range for the a previously set number of the pattern, the divisor numbers N and M that determine a clock frequency of the PPL 45 so that the time corresponding to the shading range is set slightly longer than the time corresponding to the image range. In addition, in order to set the shading start time slightly earlier than the image start time, the number of inter clocks in the delay circuit As described above, the second embodiment, only one signal, that is, the reference signal REF (APC) is operated during image formation. In a case in which the APC signal also functions as a reference signal, it is not required the signal (e.g., reset signal) to operate for the shading correction during image formation.

Third Embodiment

Figure 15:
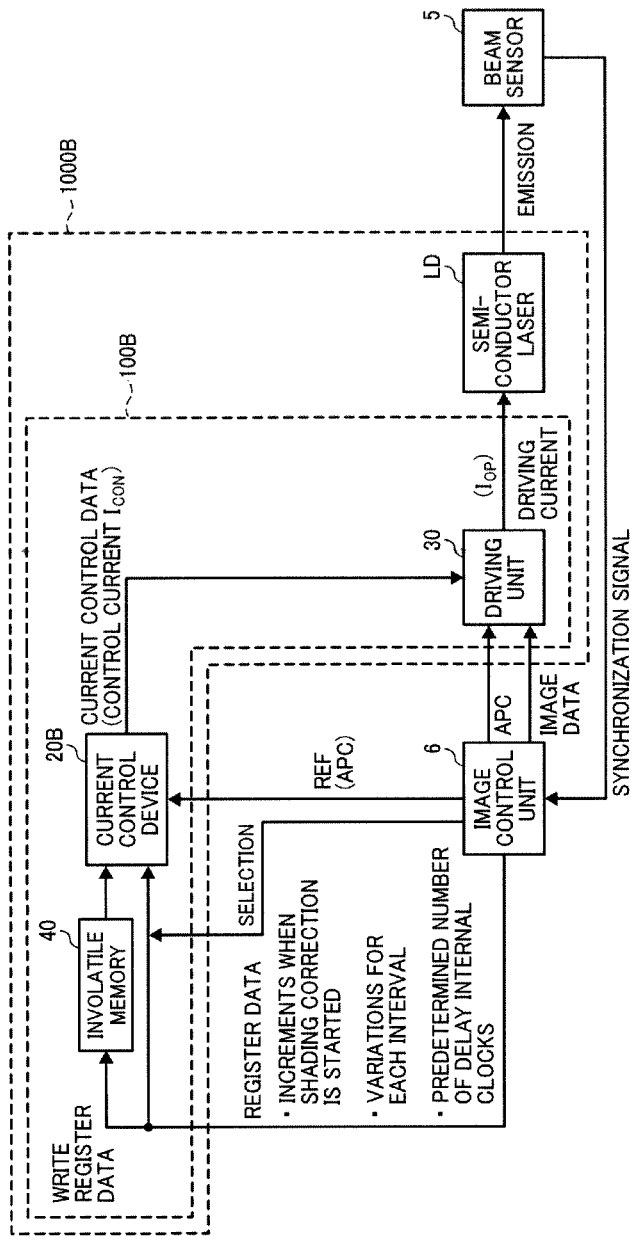
FIG. 15 is a block diagram illustrating vicinity of a semiconductor laser driver according to a third embodiment.

Next, a semiconductor laser driver 100B according to a third embodiment is described below with reference to FIG. 15. FIG. 15 is a semiconductor laser driver 100B according to a third embodiment. The semiconductor laser driver 100B further includes a nonvolatile memory 40 in addition to the component of the semiconductor laser driver 100. The nonvolatile memory 40 stores the increment for control current (driving current Iop) when shading correction is stated, the variations for each interval, and the predetermined number of delay internal clocks counted from the time at which the reference signal is input to the time the driving current starts increasing and decreasing. The increase and decrease of the driving current Iop by the current control circuit 20B is controlled based on at last one of the increment for control current (driving current Iop) when shading correction is stated, the variations for each interval, and the predetermined number of delay internal clocks counted from the time at which the reference signal is input to the time the driving current starts increasing and decreasing.

During the initial evaluation, the image control unit 6 writes the data into the register 22, and the data is stored in the nonvolatile memory 41 after the setting condition is fixed. Thus, the operations of setting the data into the register 22 for each time when the semiconductor laser driver 100 powers on can be omitted.

Next, processes of writing the data required for the shading correction into the register 22 is described below.
(Basic Operation Procedures)

After power-on rest state during which the power starts up is released, initially, the value in the nonvolatile memory 40 is written into the register 22. After that, the value in the register 22 is changeable by writing the data from the image control unit 6.
(Prerequisite)

(1) A default value before writing the nonvolatile memory is set all zero. That is, the shading operation is not performed.
(Initial Estimation)

(2) After power-on rest signal during which the power starts up is released, value (0) in the nonvolatile memory 40 is rewritten into the register.

(3) The data in the register 22 is customized based on the data for the shading correction condition by the image control unit 6 so that desired suitable image is formed.
(Manufacture Process)

(4) After power-on rest signal during which the power starts up is released, the customized shading data is written from the image control unit 6 to the nonvolatile memory 40.
(Market)

(5) After power-on rest signal during which the power starts up is released, the value in the nonvolatile memory 40 written in the manufacturing processes is written into the register 22.
(Variation)

In the semiconductor laser drivers 100, 100A, and 100B according to above-described embodiments, although the control current output from the current control circuit 20(20A, 20B) is the output current from the DAC 28, and the control current Icon is input to an input portion of the DAC 32 that determines the driving current Iop based on the current Isw generates in the DAC 32 that generates the electrical current Isw in the drive circuit 30 to generate the electrical current Isw. Alternately, the DAC 28 of the current control circuit 20 may output control code, and the control code may be added to code in the DAC 32 that generates the current Isw.

In addition, it is preferable that at least the current control circuit 20 and the drive circuit 30 may be integrated onto a single chip (integrated circuit IC).

Numerous additional modifications and variations are possible in light of the above teachings. It is therefore to be understood that, within the scope of the appended claims, the disclosure of this patent specification may be practiced otherwise than as specifically described herein.

This patent specification claims priority from Japanese Patent Application No. 2010-062456, filed on Mar. 18, 2010 in the Japan Patent Office, which is hereby incorporated by reference herein in its entirety.

What is claimed is:

1. A semiconductor laser driver to drive a semiconductor laser, the semiconductor laser driver comprising:
    a drive circuit to generate a driving current to cause the semiconductor laser to emit; and
    a current control circuit to cause the driving current to repeatedly increase and decrease in a predetermined cycle,
    wherein the driving current is increased and decreased while shading correction is performed in the semiconductor laser driver,
    wherein the current control circuit comprises a register, and the current control circuit divides the predetermined cycle into equal intervals, sets in the register increments for the driving current when shading correction is started and variations for the driving current for each interval, and increases and decreases the driving current in accordance with the increments and the variations stored in the register while shading correction is performed,
    wherein the increase and decrease of the driving current by the current control circuit is based on shading clock signals and internal clock signals, and
    wherein the current control circuit comprises:
        a counter, receiving the shading clock signals, to count the shading clock signals;
        a first register to set the increments when shading correction is started and the variations for each interval and output a level of a start code that is an initial code of a shading code while shading correction is performed and the variations for each interval;
        a multiplexer to select one of the variations output from the register;
        an encoder, receiving an internal clock signal to convert the variations output from the multiplexer into variation patterns synchronized with the internal clock signal and output the variation patterns for each interval;
        a second register, receiving the shading clock signals, the level of the start code, and a preceding code that is one preceding interval of the variation patterns to output a level of present shading code when preceding shading clock signal cycle is finished;
        an adder to add the variation patterns output from the encoder and the level of present shading code and output a shading code; and
        a digital-analog converter to convert the shading code output from the adder into a control current and output the control current to the drive circuit while shading correction is performed.

2. The semiconductor laser driver according to claim 1, wherein the current control circuit further comprises a nonvolatile memory that sets at least one of an increment of start time, a variation for each interval, and the number of clock signals from a reference signal whose cycle is equal to the cycle in which the drive current is increased and decreased repeatedly to the start of increase and decrease of the control current.

3. The semiconductor laser driver according to claim 1, wherein the current control circuit and the drive circuit are integrated on a single chip.

4. An image forming apparatus comprising:
a semiconductor laser to emit light;
an image control unit to generate image data and an automatic power control (APC) signal; and
a semiconductor laser driver to drive the semiconductor laser, the semiconductor laser driver comprising:
a drive circuit to generate a drive current to cause the semiconductor laser to emit; and
a current control circuit to cause the driving current to repeatedly increase and decrease in a predetermined cycle,
wherein the drive current is increased and decreased while shading correction is performed in the semiconductor laser driver
wherein the current control circuit comprises a register, and the current control circuit divides the predetermined cycle into equal intervals, sets in the register increments for the control current when the shading correction is started and variations for the control current for each interval, and increases and decreases the control current in accordance with the increments and the variations stored in the register,
wherein the increase and decrease of the control current by the current control circuit is based on shading clock signals and internal clock signals output from the image control unit,
wherein the current control circuit comprises:
a counter, receiving the shading clock signals, to count the shading clock signals;
a first register to set the increments when shading correction is started and the variations for each interval and output a level of a start code that is an initial code of a shading code while shading correction is performed and the variations for each interval;
a multiplexer to select one of the variations output from the register;
an encoder, receiving an internal clock signal, to convert the variations output from the multiplexer into variation patterns synchronized with the internal clock signal and output the variation patterns for each interval;
a second register, receiving the shading clock signals, the level of the start code, and a preceding code that is one preceding interval of the variation patterns, to output a level of present shading code when preceding shading clock signal cycle is finished;
an adder to add the variation patterns output from the encoder and the level of present shading code and output a shading code; and
a digital-analog converter to convert the shading code output from the adder into a control current and output the control current to the drive circuit while shading correction is performed.

5. The image forming apparatus according to claim 4, wherein the current control circuit further comprises a non-volatile memory that sets at least one of a shading clock signal, an internal clock signal, and the number of clocks from a reference signal whose cycle is equal to the cycle in which the control current is increased and decreased repeatedly and on the number of clocks from the reference signal to a time point at which the control current starts increasing and decreasing.

6. The image forming apparatus according to claim 4, wherein the current control circuit and the drive circuit are integrated on a single chip.

* * * * *